(12) United States Patent
Kinokiri et al.

(10) Patent No.: US 6,337,003 B1
(45) Date of Patent: Jan. 8, 2002

(54) VACUUM APPARATUS AND DRIVING MECHANISM THEREFOR

(75) Inventors: Kyoji Kinokiri, Tokyo; Jiro Ikeda, Shizuoka; Yoshifumi Oda, Kanagawa, all of (JP)

(73) Assignee: Shibaura Mechatronics Corporation, Yokohama (JP)

( * ) Notice: Subject to any disclaimer, the term of this patent is extended or adjusted under 35 U.S.C. 154(b) by 0 days.

(21) Appl. No.: 09/529,664

(22) PCT Filed: Aug. 18, 1999

(86) PCT No.: PCT/JP99/04434

§ 371 Date: Aug. 18, 2000

§ 102(e) Date: Aug. 18, 2000

(87) PCT Pub. No.: WO00/11237

PCT Pub. Date: Mar. 2, 2000

(30) Foreign Application Priority Data

Aug. 19, 1998 (JP) ............................................. 10-232655
Mar. 31, 1999 (JP) .............................................. 11-94041

(51) Int. Cl.[7] ............................................... C23C 14/34
(52) U.S. Cl. ............................. 204/298.15; 204/298.31; 118/728; 156/345
(58) Field of Search ........................ 204/298.07, 298.15, 204/298.25, 298.31; 118/728; 156/345

(56) References Cited

U.S. PATENT DOCUMENTS

| 4,392,939 A | * | 7/1983 | Crombeen et al. ...... 204/298.19 |
| 5,205,918 A | * | 4/1993 | Kinokiri et al. ....... 204/298.25 |
| 5,415,754 A | * | 5/1995 | Manley ................ 204/298.19 |
| 5,762,544 A | * | 6/1998 | Zuniga et al. ............... 451/285 |

FOREIGN PATENT DOCUMENTS

| JP | 55-142 350 A | * | 11/1980 |
| JP | 1-82376 | | 6/1989 |
| JP | 1-25559 | | 3/1991 |
| JP | 3-188277 | | 8/1991 |
| JP | 8-165571 | | 6/1996 |
| JP | 8-199336 | | 8/1996 |

* cited by examiner

Primary Examiner—Nam Nguyen
Assistant Examiner—Gregg Cantelmo
(74) Attorney, Agent, or Firm—Banner & Witcoff, Ltd.

(57) ABSTRACT

The invention provides a vacuum apparatus, which is equipped with a drive mechanism of small size and does not need a special mechanism for vacuum seals. This drive mechanism includes an air bag container 41 which is provided fixedly in an airtight vessel with one end open, an air bag 42 stored in the container, and a source for supplying high pressure gas penetrating through the air bag container 41. A part of the air bag 42 is projected from the open end of the air bag container 41 by supplying air bag 42 with a high pressure gas with a high pressure gas supply source 43, thereby moving objects in the vacuum vessel.

15 Claims, 11 Drawing Sheets

(A)

(B)

VACUUM APPARATUS AND DRIVING MECHANISM THEREFOR

FIELD OF INVENTION

The present invention relates to a vacuum apparatus such as a sputtering apparatus, a film deposition apparatus or an etching apparatus, and especially to a vacuum apparatus provided with a driving mechanism which transports objects including an object to be treated in the vacuum apparatus.

BACKGROUND OF THE INVENTION

Conventionally, in a magnetron sputtering apparatus for single substrate processing, which is one of a vacuum apparatus, used for manufacturing information recording disks such as CDs or DVDs, a load lock mechanism is used, which introduces an optical disk substrate made of plastics for depositing a reflection film of a metal or a semi-metal on a surface of the disk substrate into a vacuum vessel from outside using a transportation mechanism. In the sputtering apparatus, such an object to be treated as an optical disk substrate introduced into the vacuum apparatus is transported to a lower portion of a sputtering chamber by the transportation mechanism and is then transported upward into the sputtering chamber by a disk pusher mechanism which reciprocates upward and downward in a lower portion of the sputtering chamber.

In the sputtering apparatuses, both of the load lock mechanism and the disk pusher mechanism described above are provided with a lift mechanism or a driving mechanism, which reciprocates up and down inside the vacuum apparatus transporting objects to be treated. In general the lift mechanisms of the kind employ a high-pressure air cylinder or an oil pressure cylinder. The reasons why such cylinders employ them are described below. In the load lock mechanism, for example, a cylinder rod extends into the vacuum chamber through a vacuum seal from outside of the vacuum chamber. A receptacle provided at an end of the rod is butted and connected to a susceptor for holding the optical disk substrate. The susceptor is then pushed toward an upper wall of the vacuum chamber where a vacuum lid is provided. If the vacuum lid is opened, in this situation, to introduce the optical disk substrate, the object to be treated, into the vacuum chamber, the cylinder must tolerate an atmospheric pressure pushing down the susceptor. Since the atmospheric pressure pushing the cylinder amounts to a value ranging from 1270 to 1470 Newton (N), the high-pressure air cylinder or the oil pressure cylinder is used.

The lift mechanism further needs a vacuum seal because a part of the mechanism such as cylinder rod extends into a vacuum vessel forming the chamber. An O-ring seal or a bellows seal is used for the vacuum seal. The bellows seal is composed of metallic diaphragms being piled up and welded is mounted between the cylinder rod and the lift mechanism of the vacuum apparatus.

Since the lift mechanism uses the high-pressure air cylinder or the oil pressure cylinder with large space, the vacuum apparatus, therefore, becomes large. Furthermore, the O-ring seal wears severely because metallic cylinder rod slides inside the O-ring, which is furnished on the vacuum vessel and into which, a part of the lift mechanism is extended. The wear of the O-ring seal breaks the vacuum seal at the point the wear occurred, and thus hermetic seal of the vacuum vessel cannot be maintained. Although vacuum grease has been conventionally used to prevent the wear and to improve the sealing ability, peeled off film materials or broken pieces of the disk substrate are caught in the grease to be a cause of breaking vacuum seal. Furthermore, ingredients of this grease sometimes splashed in the vacuum vessel and were mixed in the film component formed on the treating object while the vacuum apparatus operates, which gave a bad influence upon a property of the film.

With respect to the bellows seal, on the other hand, fatigue occurs in a metal during a long time use since the metallic diaphragm stretches and contracts according to the reciprocate motion between the cylinder and the rod, which suddenly causes a damage in the bellows and leads to the break of the vacuum seal.

Therefore, it is an object of the present invention to provide a small and compact lift mechanism without any means or mechanism for the vacuum seal and to provide a vacuum apparatus having such lift mechanism.

DETAILED DESCRIPTION OF THE INVENTION

Figure 1:
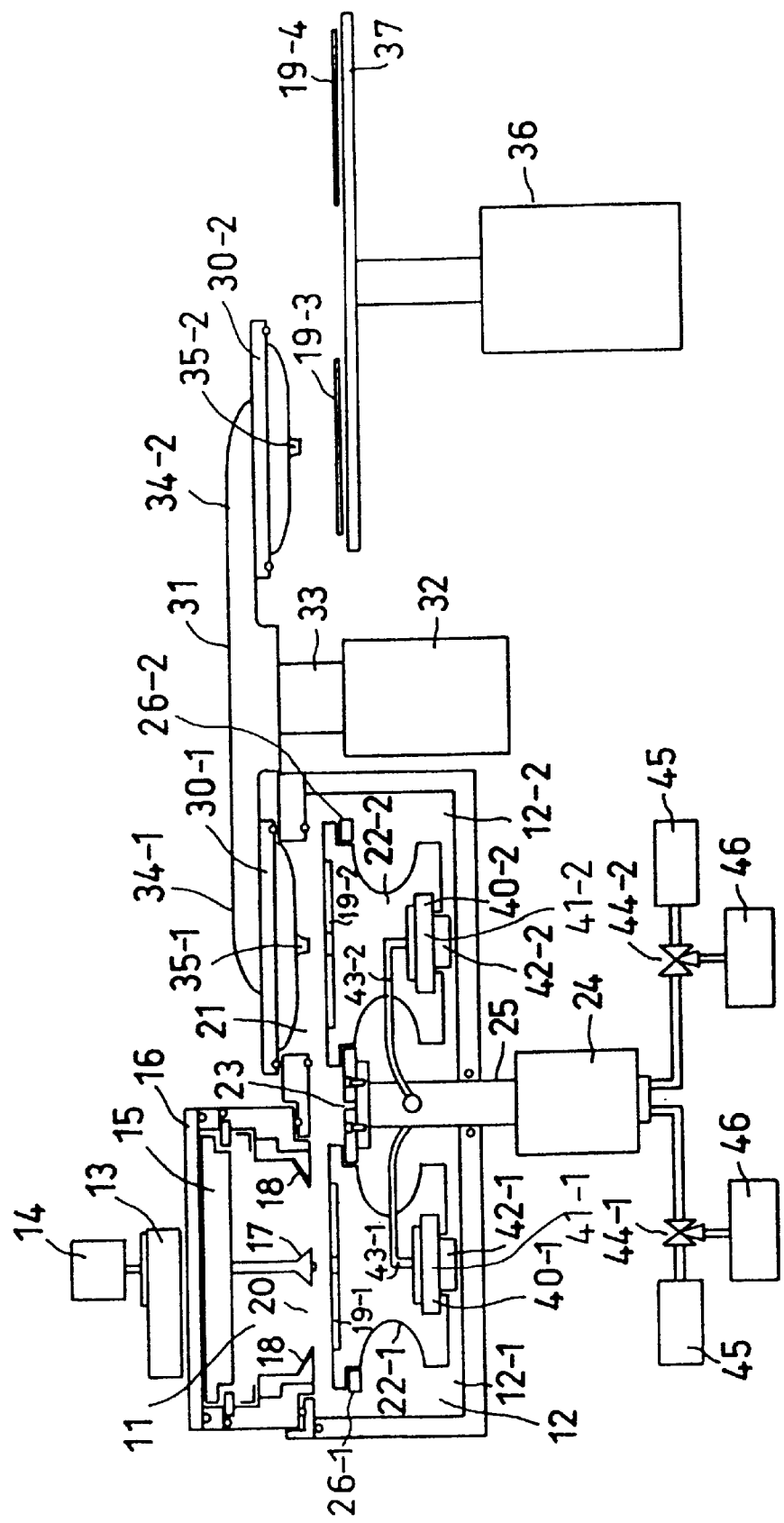
FIG. 1 shows a cross section of a sputtering apparatus as an embodiment of the present invention applied to a magnetron sputtering apparatus for single substrate processing which is one form of vacuum apparatus.

A driving mechanism for a vacuum apparatus according to the present invention comprises an air bag container with one end open, which is installed and fixed in an airtight vessel, an air bag stored in the container, and means for supplying a high-pressure gas in the air bag. Supplying the high-pressure gas into the air bag by said means for supplying a high-pressure gas, a part of the air bag is projected from the open end of the air bag container, thus transporting an object in the vacuum vessel.

Further, in the driving mechanism for a vacuum apparatus according to the present invention, means for exhausting the gas inside the air bag is provided, and the air bag, a part of which was projected from the open end of the air bag container, is withdrawn and stored inside the air bag container, by exhausting the gas inside the air bag, thus transporting the object in the vacuum vessel.

Further, in the driving mechanism for a vacuum apparatus according to the present invention, the air bag is made of an elastic material, which generates an elastic force for withdrawing the air bag into the container, when the gas inside is exhausted by the exhausting means.

Further, in the driving mechanism for a vacuum apparatus according to the present invention, the air bag is provided with an elastic means, which withdraws and stores the air bag with the elastic force into the air bag container, when inside gas is exhausted by the gas exhausting means.

Further, in the driving mechanism for a vacuum apparatus according to the present invention, the means for supplying the air bag with a high-pressure gas supplies the air bag with the gas through an opening formed in the air bag container.

Further, in the driving mechanism for a vacuum apparatus according to the present invention, the means for exhausting the gas from the air bag exhausts the gas through an opening formed in the air bag container.

Further, the driving mechanism for a vacuum apparatus according to the present invention further comprises a reinforce member for the air bag is arranged on an upper surface of the air bag container so as to close the open end, and a stopper which is fixed on the upper surface of the air bag container for guiding the reinforce member during its up and down movement and for confining the movement into a certain range.

Furthermore, a vacuum apparatus according to the present invention comprises a vacuum vessel inside which an airtight space is formed, and a driving mechanism for a vacuum apparatus arranged inside the vacuum vessel. The driving mechanism for the vacuum apparatus further comprises an air bag container with one end open, an air bag stored in the container, and a means for supplying a high pressure gas in the air bag, by supplying the high pressure gas into the air bag by the high pressure gas supply means, wherein a part of the air bag is projected from the open end of the air bag container, thereby transporting an object to be treated in the vacuum vessel.

Furthermore, a vacuum apparatus according to the present invention comprises a transport chamber having an air-tight space for transporting an object to be treated having a first and a second openings formed in a wall forming the transport chamber, a treating chamber having an airtight space which communicates with the transport chamber through the first opening, a transport mechanism provided in said transport chamber for transporting a susceptor on which an object to be treated is placed between the first and second opening, and a drive mechanism for a vacuum apparatus provided on the transport mechanism for driving the susceptor so as to open and close airtight the first and second opening. The drive mechanism for a vacuum apparatus further comprises an air bag stored in the container, a means for supplying a high-pressure gas in the air bag, wherein a part of the air bag is projected from the open end of the air bag container by supplying the air bag with a high-pressure gas by a high pressure gas supply means, thereby moving the susceptor to the first or second opening to close it airtight.

Further, in the vacuum apparatus according to the present invention, an outer transport mechanism is provided outside the transport chamber. The outer transport mechanism comprises a horizontal arm, which rotates on the vertical rotation axis and a vacuum lid, which is provided at the end of the horizontal arm for opening or closing the second opening of the transport chamber.

Further, in the vacuum apparatus according to the present invention, the process chamber is one or a plurality of sputtering chamber communicated with the transport chamber and the object to be treated is a disk substrate.

Further, in the vacuum apparatus according to the present invention, the drive mechanism for a vacuum apparatus is further provided with a means for exhausting the gas in the air bag, wherein a part of the air bag projected from the open end of the air bag container is withdrawn in the air bag container by exhausting the gas inside the air bag by the means for exhausting the gas.

Further, in the vacuum apparatus according to the present invention, the means for supplying the air bag with a high-pressure gas supplies the air bag with the gas through an opening formed in the air bag container.

Further, in the vacuum apparatus according to the present invention, the means for exhausting the gas from the air bag exhausts the gas through an opening formed in the air bag container.

Furthermore, a vacuum apparatus according to the present invention comprises a sputtering chamber having an airtight discharge space, a magnetic field generating apparatus arranged on a portion above the sputtering chamber so as to generate a magnetic field in said sputtering chamber, a target arranged at an upper portion of the sputtering chamber to which the magnetic field is applied by the magnetic field generating device, a transport chamber which communicates with the sputtering chamber through an opening formed on a bottom wall of the sputtering chamber and provides an airtight space extended horizontally from a bottom portion of the chamber, having a transport chamber opening provided on a ceiling portion of the airtight space, an internal disk transport mechanism provided in the transport chamber for transporting a susceptor for placing a disk substrate on which a sputtering film is formed, between the opening of the transport chamber and the opening of the sputtering chamber alternately, a plurality of vacuum lids which couples to the opening of the transport chamber for sealing airtight and removably holds the disk substrates on the lower surface, an outer disk transport mechanism which transports the vacuum lids alternately between the opening of the transport chamber and a disk support table, which is arranged at a position separated from transport chamber.

The driving mechanism for the vacuum apparatus further comprises an air bag container mounted on a bottom portion of the susceptor with its lower end open, an air bag stored in the container, a means for supplying a high pressure gas in the air bag, wherein it is characterized in that a part of the air bag projects from the lower open end of the container and contacts to press a bottom plane of the transport chamber by supplying the air bag with the high pressure gas into, and that an upper surface of the susceptor is thus made contact with the opening of the transport chamber to seal it hermetically.

Furthermore, in the vacuum apparatus according to the present invention, a second drive mechanism is provided on a upper surface of the susceptor for lifting the disk substrate from the upper surface of the susceptor when the susceptor is made contact to the opening of transport chamber or to the opening of the sputtering chamber, thereby inserting the disk substrate into a disk chucking mechanism provided on the vacuum lid of the outer disk transport, or making the disk substrate on a center mask in the sputtering chamber.

A vacuum apparatus according to the present invention comprises a disk transport chamber having a plurality of inner walls forming a polygonal space and a plurality of openings formed on each of the walls, a hollow rotating shaft vertically extending at a center of the disk transport chamber, a frame which is arranged around the rotating shaft and rotates with the rotation of the rotating shaft, a plurality of air bag drive mechanisms mounted on outer planes of the frame, a plurality of pipes connected to the air bag drive mechanism through the hollow rotating shaft for supplying a high pressure gas to or exhausting from the air bag drive mechanism, a plurality of susceptors which are driven by each of said plurality of air bag drive mechanism to seal openings formed in the walls of the disk transport chamber, a plurality of sputtering chamber provided outside the disk transport chamber so as to communicate with the disk transport chamber, and a load lock mechanism which is arranged outside the disk transport chamber for carrying the disk substrates into or out of the disk transport chamber through the openings.

Furthermore, in the vacuum apparatus according to the present invention, the plurality of sputtering chambers are equipped with targets composed of each different materials and form different kinds of films on said disk surfaces.

The embodiment of the invention is explained below referring to the accompanying figures.

FIG. 1 is a cross section of sputtering apparatus showing an embodiment of the present invention, which is applied to a magnetron sputtering apparatus, as an example of a vacuum apparatus.

The sputtering apparatus has a sputtering chamber 11, which is a nearly cylindrical airtight vessel and a disk transport chamber 12 that is also an airtight vessel. The disk transport chamber 12 is provided under the sputtering chamber 11 and is communicating with sputtering chamber 11. On an upper wall of the sputtering chamber 11, a magnet device 13 is mounted which is rotated by a motor 14.

A disk shaped target 15 made of a film forming substance is mounted on a water-cooling backing plate 16 provided on the upper wall inside the sputtering chamber 11. From the center portion of target 15, a center mask 17 is suspended vertically in the sputtering chamber 11. An opening 20 for exposing an upper surface of a disk substrate 19 to sputtering chamber 11 is formed in a wall 18 separating the sputtering chamber 11 from the disk transport chamber 12.

The disk transport chamber 12 has a first airtight space 12-1 located under sputtering chamber 11 and a second airtight space 12-2 extended horizontally from the first airtight space 12-1. The first and second airtight spaces are formed as a whole nearly cylindrical or semi-cylindrical. A transport chamber opening 21 is provided in a ceiling portion of the second airtight space 12-2. Inside the disk transport chamber 12, an internal disk transport mechanism 23, which is provided with a plurality of susceptors 22-1, 22-2 for placing a plurality of disk substrates 19-1, 19-2 respectively. This internal disk transport mechanism 23 rotates to transport disk substrates 19-1, 19-2 reciprocally between sputtering chamber opening 20 and transport chamber opening 21. The internal disk transport mechanism 23 is equipped with a rotating shaft 25 arranged vertically at the center portion of disk transport chamber 12, and is rotated and driven by a motor 24 mounted under the disk transport chamber 12. On the top portion of the rotating shaft 25, a plurality of ring shaped horizontal arm 26-1, 26-2 are fixed, on which susceptors 22-1, 22-2 are placed respectively.

At the transport chamber opening 21 provided in the ceiling of second airtight space 12-2, a plurality of vacuum lids which couple to the opening for sealing airtight and which removably hold the disk substrates 19-1, 19-2 on their lower surfaces. These pluralities of vacuum lids 30-1, 30-2 are transported by external disk transport mechanism 31 provided outside the disk transport chamber 12. Specifically, the external disk transport mechanism 31 is equipped with a rotating vertical shaft 33 which is rotated and driven by motor 32. Horizontal arms 34-1 and 34-2 are fixed on a top of the rotating shaft 33 which are radially extending from the rotating shaft 33. Vacuum lids 30-1, 30-2 for sealing the transport chamber opening 21 are fixed at the ends of these horizontal arms 34-1, 34-2. Mechanical chucks 35-1, 35-2 are mounted on lower surfaces of vacuum lid 30-1, 30-2, which are inserted in center holes of the disk substrate 19 to catch and release the disks. With these mechanical chucks 35-1, 35-2 the disk substrate 19 is transported. Outside disk transport chamber 12, a disk transport table 37 is provided which rotates in the horizontal plane by motor 36.

A plurality of disk substrates 19-3, 19-4 is placed on the disk transport table 37. When the disk transport table 37 rotates so as to move the disk substrate 19-3 to a portion under vacuum lid 30-2 being transported by the external disk transport mechanism 31, the vacuum lid 30-2 chucks the disk substrate 19-3. The disk substrate 19-3 thus chucked is transported to the transport chamber opening 21 of the disk transport chamber 12 by the rotation of external disk transport mechanism 31. The substrate 19-3 is then released from the lower surface of the vacuum lid 30-2 and is placed on the susceptor 22-2 inside the disk transport chamber 12 when the vacuum lid 30-2 is coupled with the transport chamber opening 21. The disk substrate in this state is shown as 19-2 in the FIG. 1.

On the bottom portion of susceptor 22-1,22-2, drive mechanisms 40-1,40-2 for the vacuum apparatus are mounted. These drive mechanisms for the vacuum apparatus, which will be described later in detail referring to FIG. 2 to FIG. 5, are composed of air bag containers 41-1,41-2 with an open lower end, air bag 42-1,42-2 stored in said containers, and pipes 43-1,43-2 which supply a high pressure gas into these air bag through the air bag container 41-1,41-2. One ends of these high pressure gas supply pipes 43-1,43-2 are led out of the disk transport chamber 12 through the hollow portion (not illustrated) inside the rotating shaft 25 of disk transport mechanism 23. Three-way valve 44-1 and 44-2 are connected to the ends of pipes 43-1,43-2, respectively. These valve 44-1 and 44-2 connect the pipes 43-1,43-2 to a high-pressure gas source 45 and to a exhaust pump selectively. When these three-way valves 44-1,44-2 are switched to high pressure gas source 45 and the high pressure gas is supplied to the air bags 42-1, 42-2, a part of the air bags 42-1,42-2 is projected from the lower open end of the air bag container 41-1, 41-2 and contact with a bottom surface of the disk transport chamber 12. In this situation, if more high pressure gas is supplied into the air bags 42-1,42-2 from the high pressure gas supply, the projected portion of the air bags 42-1,42-2 pushes the bottom of the transport chamber 12, thereby lifting the susceptors 22-1,22-2 towards the opening 20 of the sputtering chamber 11 or transport chamber 12 respectively until upper surfaces come in contact with the opening 20 or 21 to seal them hermetically.

Figure 2:
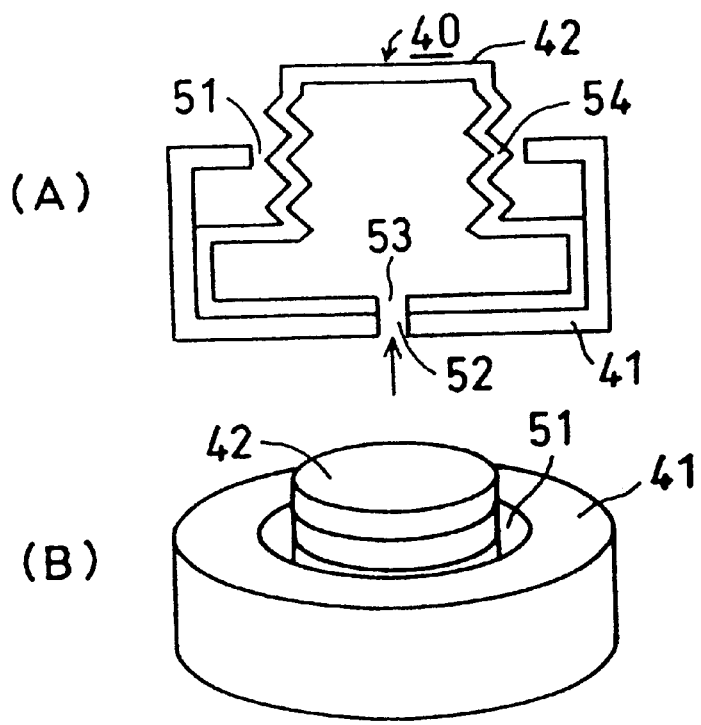
FIG. 2 shows an embodiment of a driving mechanism for a vacuum apparatus according to the present invention, wherein (A) is a cross section, (B) is a perspective view.

FIG. 2 to FIG. 5 show a structure of a drive mechanism for a vacuum apparatus, wherein figures (A) are cross sectional views and Fig figures (B) are perspective views of the driving mechanism. The drive mechanism 40 shown in FIG. 2 is equipped with cylindrical air bag container 41. An opening 51 is formed in an upper wall of the air bag container 41, and a through hole 52 is formed in the bottom wall of the air bag container 41. In the air bag container 41, an air bag 42 is stored in the air bag container 41 on the bottom of which an air introducing hole 53 is formed to communicate with the through hole 52 of the air bag container 41. The bottom of the air bag 42 is fixed at the bottom of the air bag container 41. A bellows 54 forms a middle and an upper portion of the air bag 42 having a smaller diameter than the rest of the air bag 42. The bellows 54 is projected outside container 41 through the opening 51 of the air bag container 41 when the bellows 54 extends. The air bag 42 is made of such an organic elastic material as urethane rubber or Buna rubber, for example. When the air bag 42 is evacuated to nearly a vacuum, almost all parts of the bellows 54 is stored in the container 41 while a top portion of the air bag 42 is remained outside container 41. Further, container 41 is made of harder materials such as a metal, for example, which is not deformed easily.

The high pressure gas supply pipes 43-1,43-2 shown in FIG. 1 are coupled to the through hole 52 of the air bag container 41, through which a high pressure gas is supplied into the air bag 42. As a result, the air bag 42 is filled with a high-pressure gas and the bellows 54 expands to project outside container 41 through the opening 51. In this situation, bellows 54 does not pass through the opening 51 but remains inside container 41, because the lower portion of the air bag 42 has a diameter larger than that of the bellows 54. The portion of the bellows 54 which projects outside the air bag 42 through the opening 51 of container 41 pushes other objects which is in contact with a top of the portion of the bellows 54. In FIG. 1, the drive mechanisms 40-1,40-2 for a vacuum apparatus are mounted at the bottom of the susceptor 22-1,22-2 with upside down with respect to that shown in FIG. 2. Thus, the top portion of the air bag 42 extended and projected outside container 41 pushes a bottom surface of the disk transport chamber 12, thereby lifting the susceptors 22-1,22-2.

When the high-pressure gas is filled in air bag 42, the three-way valves 44-1,44-2 shown in FIG. 1 are switched to exhaust pump 46 and exhaust the gas inside air bag 42. The bellows 54 of the air bag 42 thus shrinks by its elastic force, with the top portion being located outside container 41 but almost all the portions returning into container 41, as shown in FIG. 2.

Figure 3:
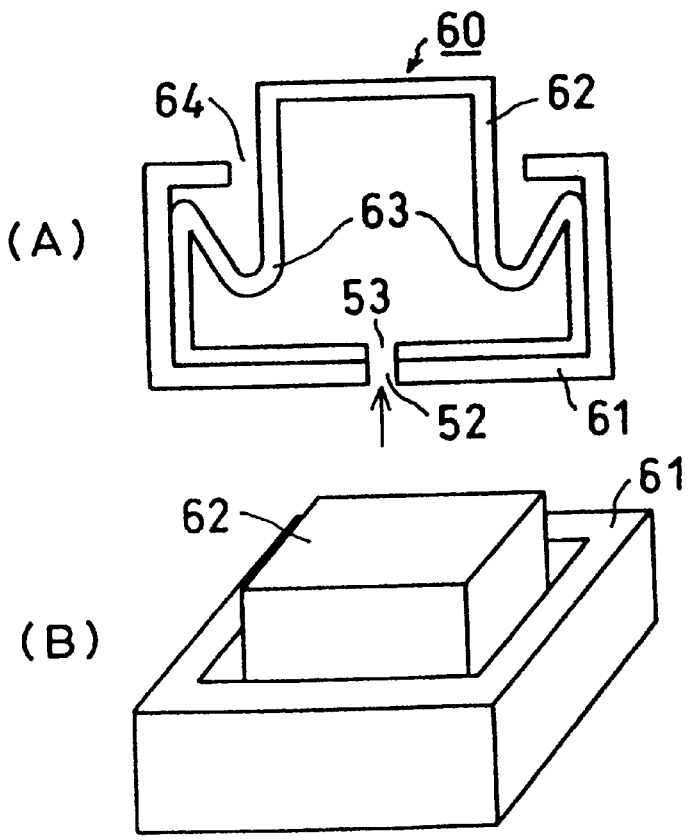
FIG. 3 shows another embodiment of a driving mechanism for a vacuum apparatus according to the present invention, wherein (A) is a cross section, (B) is a perspective view.

A drive mechanism 60 for a vacuum apparatus shown in FIG. 3 has a similar structure to the drive mechanism 40 for a vacuum apparatus in FIG. 2 except that air bag container 61 is a rectangular box and a bellows 63 has a different structure, with which an air bag 62 stored in the air bag container 61 shrinks and expands. For this reason, the same or corresponding components are indexed with the same symbols and detailed explanation is omitted bellow. The bellows 63 of the air bag 62 in the drive mechanism 60 for a vacuum apparatus is bent in "S" shape in its vertical section. That is to say, a main body forming a lower portion of the air bag 62 has a similar shape and area in its horizontal section to a bottom surface of the air bag container 61 but an upper portion of the air bag 62 has a rectangular shape with a smaller area in its horizontal section than a rectangular opening 64 formed on a top wall of the air bag container 61. The upper and the lower portions of the air bag 62 are connected with each other by the bellows 63 being bent in the "S" shape in its cross section as described above. When the high-pressure gas is supplied into the air bag 62, the bellows 63 extends and thus makes the top portion move outside the air bag container 61 to a higher portion through the opening 64. When the gas inside the air bag 62 is evacuated, the bellows 63 contracts by its elastic force and thus make the top portion located outside the air bag container 61 descend into the air bag container 61 through the opening 64.

Figure 4:
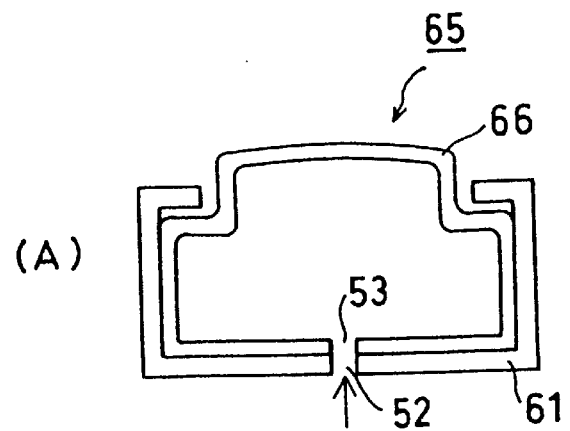
FIG. 4 shows yet other embodiment of a driving mechanism for a vacuum apparatus according to the present invention, wherein (A) is a cross section, (B) is a perspective view.

A drive mechanism 65 for a vacuum apparatus shown in FIG. 4 has nearly the same structure as the drive mechanism 60 for a vacuum apparatus shown in FIG. 3 except for the extending and contracting mechanism. Therefore, the same components are indexed with the same symbols and a detailed explanation is omitted. The air bag 66 of the drive mechanism 65 is not provided with bellows 54, 63 of the air bags 42, 62 shown in FIG. 2 or FIG. 3, but is formed so as to extend and contract by the elastic force of the whole air bag 66.

Figure 5:
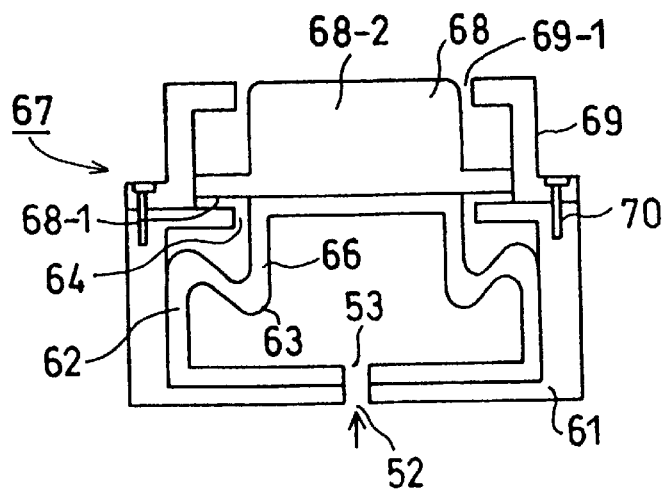
FIG. 5 shows a cross section of a yet other embodiment of a driving mechanism for a vacuum apparatus according to the present invention.

FIG. 5 is a cross sectional view of a drive mechanism for a vacuum apparatus showing a further different embodiment according to the present invention. In this figure, the same components as those of the drive mechanism 60 for a vacuum apparatus in FIG. 3 are indexed with the same symbols and a detailed explanation is omitted. In a drive mechanism 67 for a vacuum apparatus shown in FIG. 5, an reinforce member 68 for covering an opening 64 is provided over a rectangular opening 64 formed on an upper surface of an air bag container 61. A bottom portion 68-1 of the reinforce member 68 has an area sufficient to cover the opening 64 of the air bag container 61. A main body 68-2 has a smaller area in a horizontal section than the area of the bottom portion 68-1. The reinforce member 68 has a nearly inverted "T" shape in its vertical section. The reinforce member 68 is made of a material, which is highly strong and is not easily deformed such as a metal compared with the main body of air bag 62, which is made of elastic organic material. Around the opening 64 of the air bag container 61, a stopper 69 is fixed by bolts 70. The stopper 69 is provided for guiding the reinforce member 68 to move upward and downward and for limiting the movement within a certain range. That is to say, the stopper 69 is a box having an opening 69-1 on a top portion through which a main body 68-2 of the reinforce member 68 is able to pass, so that the reinforce member 68 moves up and down being guided within the box. A moving stroke of the reinforce member 68 is between a lower limit wherein the bottom portion 68-1 contacts the upper surface of the air bag container 61 and an upper limit wherein the bottom portion 68-1 reaches the opening 69-1 of stopper 69. The reinforce member 68 is not allowed to pass the opening 69-1 and thus stops moving there since the reinforce member 68 has a larger area at the bottom portion 68-1 than the area of opening 69-1.

In the drive mechanisms for a vacuum apparatus shown in FIG. 2 to FIG. 4, a part of the air bag made of elastic organic material projects into a vacuum chamber by being supplied with a high pressure gas, although the air bag is covered by the air bag container made of metal. The air bag, therefore, inflates until it bursts if there is not provided any structure, which receives the projecting portion of the air bag. To remove such fear and to secure safe and accurate operation, the driving mechanism for a vacuum apparatus shown in FIG. 5 is provided with a reinforce member 68 made of a metal etc. at the projecting portion of the air bag so that the air bag 62 may not expand outside the container 61 exceeding a safe stroke.

Figure 6:
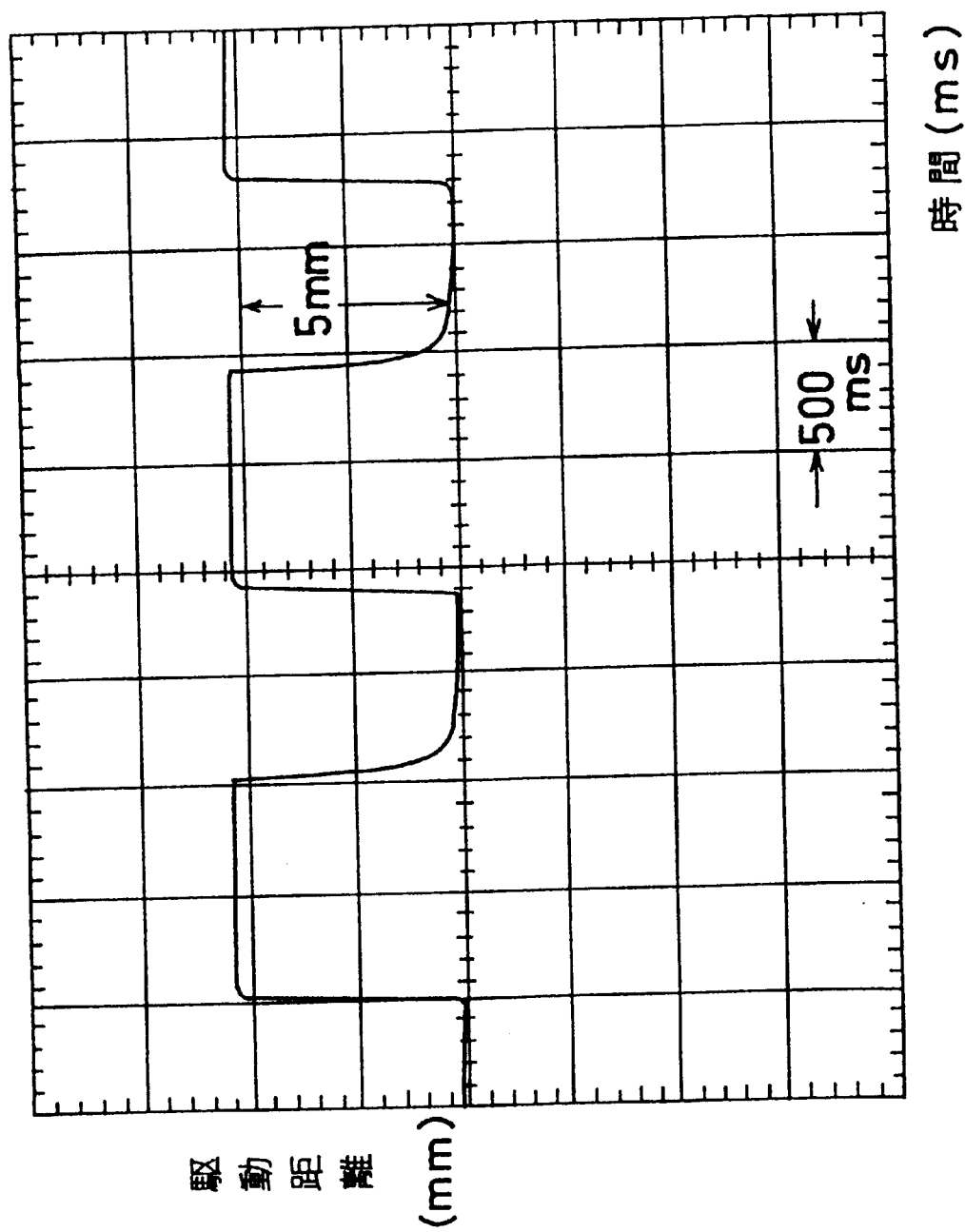
FIG. 6 is a graph showing a driving cycle of the driving mechanism for a vacuum apparatus according to the present invention.

FIG. 6 is a graph showing a drive cycle by the drive mechanism for a vacuum apparatus thus constructed. The horizontal axis of the graph represents time wherein one section corresponds to 100 msec. The vertical axis represents a driving distance by the drive mechanism for a vacuum apparatus wherein one section corresponds to 0.5 mm. This graph shows a change of a moving distance of the top portion of air bag of the drive mechanism for a vacuum apparatus placed in a vacuum atmosphere when the drive mechanism is supplied with a high pressure gas and is exhausted alternately nearly once a second. This graph shows that a rise time of the drive mechanism for a vacuum apparatus is 0.02 sec and a fall time thereof is 0.09 sec.

An operation of the magnetron sputtering apparatus for single substrate processing in FIG. 1 is now explained. Firstly, the drive mechanism 40-2 for a vacuum apparatus mounted on the lower surface of the susceptor 22-2 which is arranged in the second airtight space 12-2 of the disk transport chamber 12 is driven by the high pressure gas source 45. The drive mechanism 40-2 for a vacuum apparatus raises susceptor 22-2 to a level higher than an upper surface of the horizontal arm 26-2, so that the opening 21 of the transport chamber is sealed hermetically by the upper surface of the susceptor 22-2.

On the other hand, the substrates 19-3, 19-4, which are placed on the disk transport table 37 to be subject to a sputter treatment, are chucked at the lower surface of vacuum lid 30-2 transported by the external transport mechanism 31. The vacuum lid 30-2 is rotated and transported to the opening 21 of the disk transport chamber 12 by the external disk transport mechanism 31 as shown by the vacuum lid 30-1 of FIG. 1. The vacuum lid 30-1 couples to the opening 21 of transport chamber 12 to seal it airtight and releases the disk substrate 19-3 being chucked at the lower surface on the susceptor 22-2 in the disk transport chamber 12. The disk substrate 19-2 in the figure shows the situation. Thereafter, the drive mechanism 40-2 for a vacuum apparatus is driven by exhaust pump 46, so that the susceptor 22-2 may be descended to a level equal to the upper surface of the horizontal arm 26-2. In this state, the internal disk transport mechanism 23 is rotated by the motor 24 so that the susceptor 22-2 is transported into the first airtight space 12-1. This situation is shown by susceptor 22-1, disk substrate 19-1, and drive mechanism 40-1 for a vacuum apparatus in FIG. 1.

Susceptor 22-1 provided in the first airtight space 12-1 of the disk transport chamber 12 is driven by the driving mechanism 40-1 a for a vacuum apparatus mounted on its lower surface. The susceptor 22-1 is thus elevated over the upper surface of the horizontal arm 26-1 and seals with its upper surface the opening 20 of the sputtering chamber 11, which is formed on the wall 18 separating the sputtering chamber 11 and the disk transport chamber 12. The sputtering chamber 11 is thus closed airtight. The center mask 17 is coupled to the center hole of the disk substrate 19-1.

Then, an argon gas is introduced into the sputtering chamber 11 from a gas introducing opening (not illustrated) and a high voltage for discharging is applied between an upper wall and a side wall of the sputtering chamber 11. A rotating magnetic field generated by the magnet device 13 is applied in the sputtering chamber 11, so that plasma is generated by the discharge in the sputtering chamber 11. With the discharge, a target material is emitted from a lower surface of the target 15, and is deposited to form a sputtering film on an upper surface of the disk substrate 19-1, placed on the susceptor 22-1.

After the process for forming the sputtering film on the disk substrate is completed, the drive mechanism 40-1 is driven again, so that the susceptor 22-1 descend to the upper surface of the horizontal arm 26-1. The internal disk transport mechanism 23 then is rotated and driven by the motor 24, so that the susceptor 22-1 is transported to the second airtight space 12-2. This state is shown by susceptor 22-2, disk substrate 19-2 and the drive mechanism 40-2 for a vacuum apparatus in FIG. 1.

In the next, the drive mechanism 40-2 mounted on the lower surface of susceptor 22-2 is driven again, so that the susceptor 22-2 is raised to a level higher than the upper surface of the horizontal arm 26-2, and that the opening 21 of the transport chamber 12 is sealed airtight by the upper surface of susceptor 22-2 in the disk transport chamber 12. The disk substrate 19-2 is thus chucked by the vacuum lid 30-1 on the lower surface, and is transported onto the disk transport table 37 by the rotating external disk transport mechanism 31. The disk substrate 19-2 is then released from the lower surface of the vacuum lid 30-1 on the disk transport table 42. This state is shown by the disk substrate 19-3 in FIG. 1. The disk substrate 19-3 is then transported by the disk transport table 37 and is taken out as a disk substrate 19-4 with a sputter film formed on its surface.

As shown in the description of the embodiment of the present invention, the drive mechanism 40-1, 40-2 for a vacuum apparatus according to the present invention has an advantage that the sealing for vacuum is not necessary, because the whole drive mechanism is provided in the disk transport chamber 12 forming a vacuum apparatus. Thus, the problems such as wear of O-ring for vacuum seal or mixing of impurities into sputtering film do not occur.

Since the drive mechanisms 40-1, 40-2 according to the present invention are small in its size, size of the vacuum apparatus can also be made small.

Further, there is no need that a relative position between the drive mechanism 40-1 or 40-2 for a vacuum apparatus and an object to be pushed such as the bottom surface of the disk transport chamber 12 is kept precisely since the drive mechanism for a vacuum apparatus of the present invention push the object by a top portion of the deformable air bag 42. There is, therefore, freedom in deciding positions for installing the drive mechanisms 40-1, 40-2 in the vacuum apparatus and thus space can be used effectively.

Further, according to the drive mechanism 40-1, 40-2 for a vacuum apparatus of the present invention, there is no need for skill with respect to replacement and maintenance of the air bag 42 compared with the replacement and maintenance of the conventional O-ring seal or bellows, so that the replacement can be done in a short time.

Figure 7:
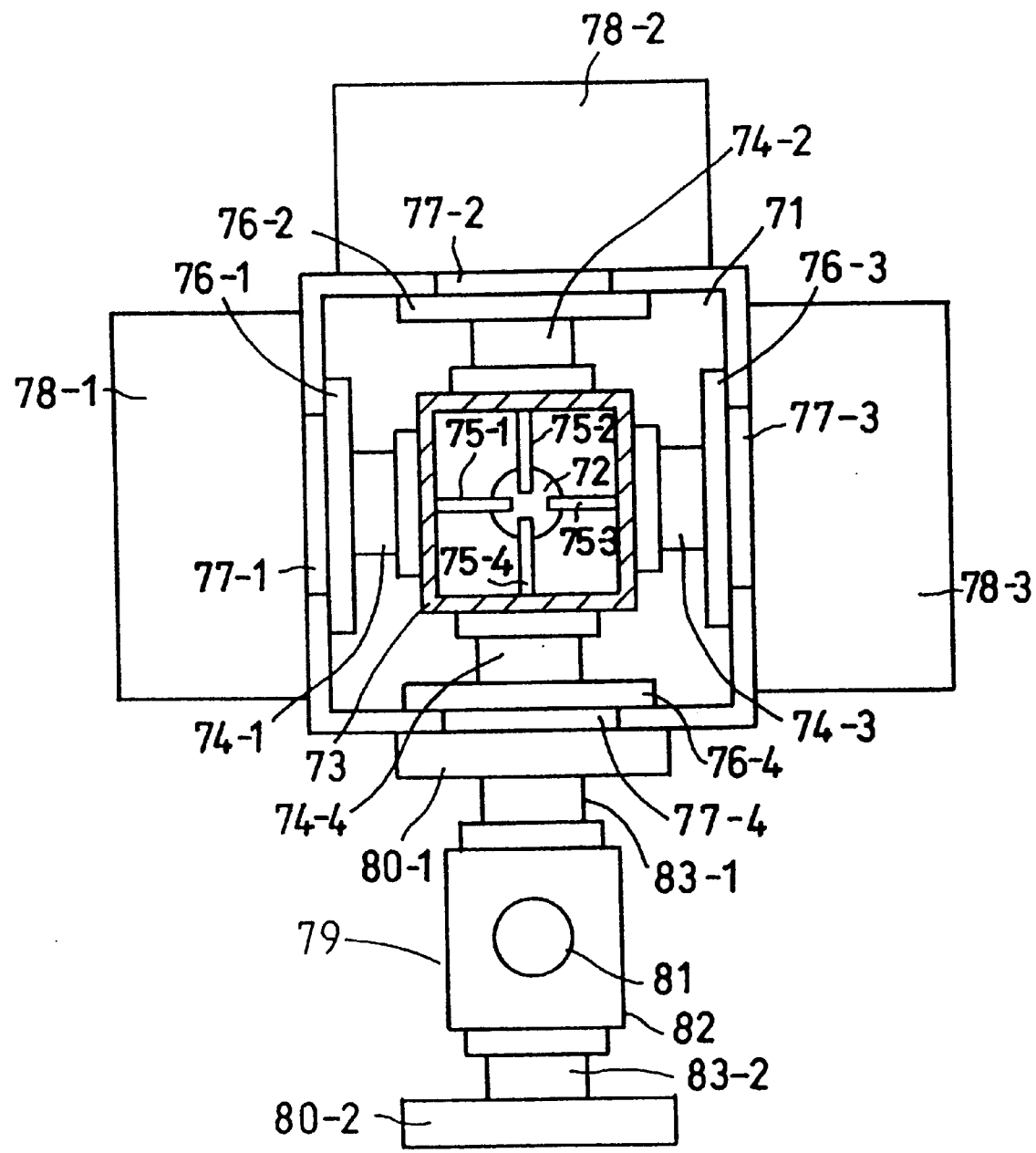
FIG. 7 shows a horizontal section of an embodiment of a multi-purpose sputter deposition apparatus according to the present invention.

FIG. 7 is a view showing a horizontal section of an embodiment of a multi-purpose sputtering apparatus for forming a film according to the present invention. A hollow rotating shaft 72 having a nearly square section and extending vertically is provided at a center portion of a airtight disk transport chamber 71. A frame 73 is provided around the rotating shaft 72. The frame 73 having a nearly square shape in a horizontal section rotates in a horizontal plane with rotation of the rotating shaft 72. On external surfaces of four walls forming the frame 73, four air bag drive mechanisms 74-1 to 74-4 such as shown in FIG. 2 to FIG. 4 are provided respectively. Pipes 75-1 to 75-4 are connected to these air bag drive mechanisms 74-1 to 74-4. The pipes 75-1 to 75-4 are introduced from outside through the hollow rotating shaft 72. A high-pressure gas is supplied or exhausted to and from the air bag drive mechanisms 74-1 to 74-4 through pipes 75-1 to 75-4. These four air bag drive mechanisms 74-1 to 74-4 push susceptor 76-1 to 76-4 respectively to close openings 77-1 to 77-4 which are formed on the four walls around the disk transport chamber 71. On three of the outer walls of the disk transport chamber 71, three sputtering chambers 78-1 to 78-3 are mounted to communicate through the openings 77-1 to 77-3 respectively. These three sputtering chambers 78-1 to 78-3 operate under different conditions for performing multi-purpose sputtering. For example, targets made of different material (not illustrated) from each other are provided to form different kinds of films. A load lock mechanism 79 is provided outside the disk transport chamber 71. The load lock mechanism 79 includes a second frame 82. The second frame 82 rotates with a second hollow rotating shaft 81 which extended vertically. Air bag drive mechanisms 83-1, 83-2 are provided on opposite outer walls of the frame 82. These air bag drive mechanisms 83-1, 83-2 are those shown in FIG. 2 through FIG. 4. These air bag drive mechanisms 83-1, 83-2 are supplied with a high pressure gas by high pressure gas supply pipes (not illustrated) introduced from outside through the second hollow rotating shaft 81. The air bag drive mechanisms 83-1, 83-2 come into contact with disk transport tables 80-1, 80-2 to close a opening 77-4 which is formed on the wall of the disk transport chamber 71 by projecting a part of an air bag included in each of the air bag drive mechanisms 83-1, 83-2. A disk substrate on which a sputter film is formed is loaded on disk transport tables 80-1, 80-2. The load lock mechanism 79 introduces the disk substrates from outside into the disk transport chamber 71, or takes the disk substrates out of the disk transport chamber 71 through the opening 77-4.

The multi-purpose sputtering apparatus for forming a film according to the embodiment of the present invention is able to install all the air bag drive mechanism 74-1 to 74-4 for driving susceptor 76-1 to 76-4 inside the disk transport chamber 71 which is an airtight vessel, so that there is no need for such a hermetic seal means including a reciprocating piston as a conventional cylinder mechanism. Therefore, a simplified and small apparatus can be obtained. The load lock mechanism 79 provided outside the disk transport chamber 71 is also simplified and made small.

Figure 8:
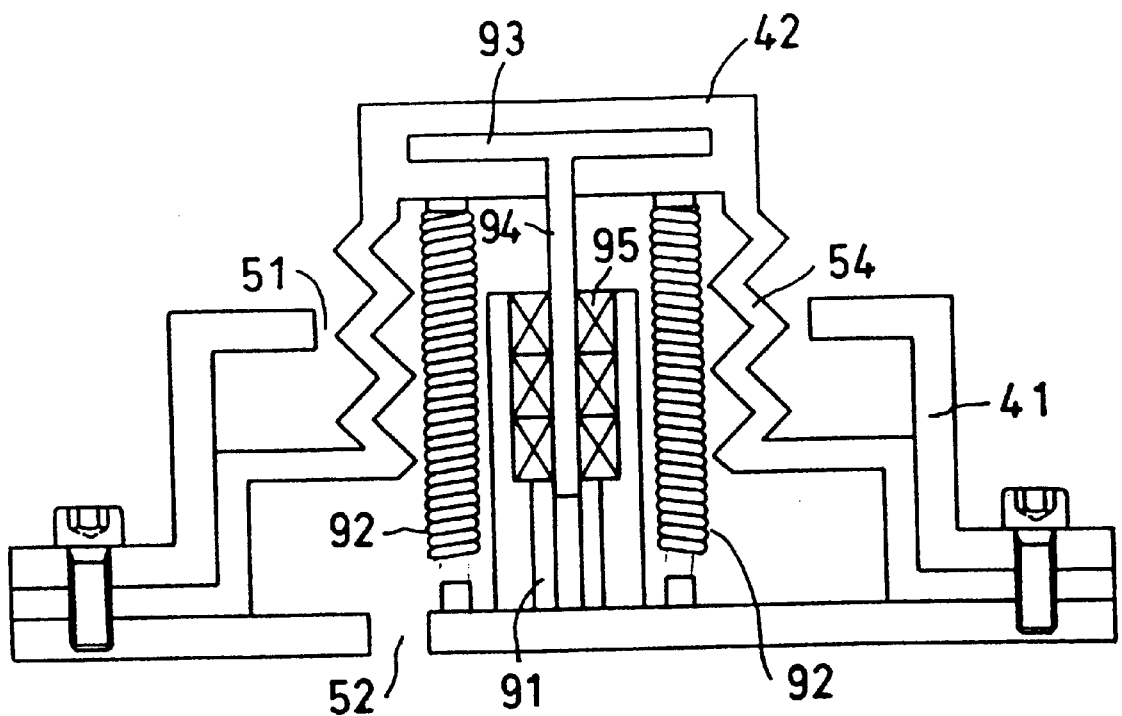
FIG. 8 shows a cross section of other embodiment of the air bag drive mechanism according to the present invention.

FIG. 8 is a cross sectional views showing other embodiment of an air bag drive mechanism according to the present invention. In FIG. 8, since the fundamental structure is the same as the air bag drive mechanism shown in FIG. 2, the same or corresponding components are indexed with the same symbols as those in FIG. 2 and detailed explanation is omitted.

In this embodiment, a guide mechanism 91 for guiding a bellows 54 in a direction of expansion and contraction is provided inside the air bag 42 as well as a spring mechanism 92 for restoring the bellows 54 when a high pressure gas are exhausted. At a top portion of the air bag 42, a metal disk 93 is buried in a thick wall of the air bag. A piston shaft 94 is connected to a center portion of the metal disk 93 at its one end. The other end of the piston shaft 94 extends vertically in the air bag 42. The piston shaft 94 is held by a journal 95 provided in the guide mechanism 91 for guiding the piston shaft 94 in its reciprocal movement in the vertical direction. By supplying oil lubricant in this journal 95, a smooth reciprocal movement of the piston shaft 94 is secured. Spring mechanism 92 is composed of a plurality of springs connecting peripheral portions of the metal disk 93 and a bottom wall of air bag container 41.

In the air bag drive mechanism thus constructed, the bellows 54 of the air bag 42 extends to raise the top portion of the air bag 42, when high pressure air is supplied from a through hole 52 provided in the bottom wall of the air bag container 41. The metal disk 93 in the top portion of the air bag 42 moves in the vertical direction with high directional precision, because the piston shaft 94 is guided by the journal 95. At the same time, the spring mechanism 92 extends with the rise of the top portion of the air bag 42.

On the other hand, when the high pressure air is exhausted from the through hole 52 and pressure inside the air bag 42 is decreased, the metal disk 93 in the top portion is pulled downward by restoring of the spring mechanism 92. As a result, the bellows 54 also restores. At this time, since the piston shaft 94 connected with the metal disk 93 is guided by the journal 95, the top portion of the air bag 42 descends in the vertical direction with a high directional precision.

The air bag drive mechanism according to the embodiment is thus able to improve the positional precision in the driving by the air bag made of a soft elastic material through its expansion and contraction. According to the embodiment of the present invention, an oil lubricant can be used even if the air bag drive mechanism is used in a vacuum vessel because the guide mechanism is provided inside the sealed air bag.

Figure 9:
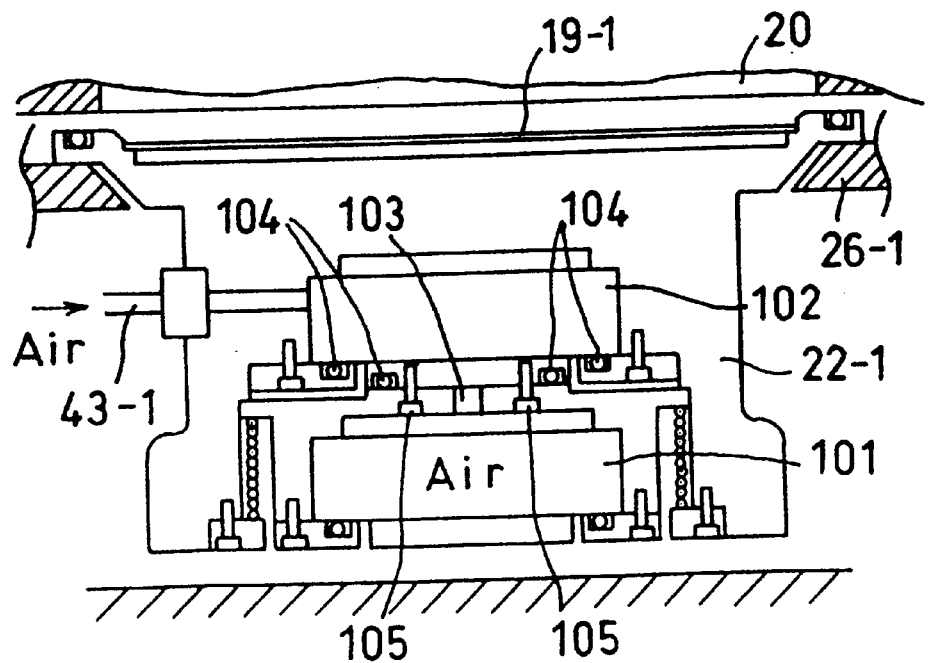
FIG. 9 shows a cross section of a part of the vacuum apparatus according to the present invention.

FIG. 9 is a cross sectional view partly showing a vacuum apparatus according to a different embodiment of the present invention. The portion of the vacuum apparatus shown in FIG. 9 corresponds to the portion including the susceptor 22-1 held by the internal disk transport mechanism 23 in the vacuum apparatus shown in FIG. 1. Therefore, corresponding parts are indexed with corresponding symbols to those in FIG. 1 and detailed explanation is omitted here.

In this embodiment, two air bag drive mechanisms 101, 102 are superimposed vertically in two stages in the susceptor 22-1. A communication opening 103 is provided at the projecting portion of the air bag of the air bag drive mechanism 101 in the first stage. The communication opening 103 is coupled with the high-pressure gas-introducing opening (not illustrated) of the air bag drive mechanism 102 in the second stage. A multi stage air bag drive mechanism is thus formed. The air bag drive mechanisms 101, 102 are connected with screws 105, 105 through a plurality of hermetic seal 104. The drive mechanism with the structure described provides a large moving stroke, which is a sum of strokes of the projected portions of the drive mechanisms in two stages.

Figure 10:
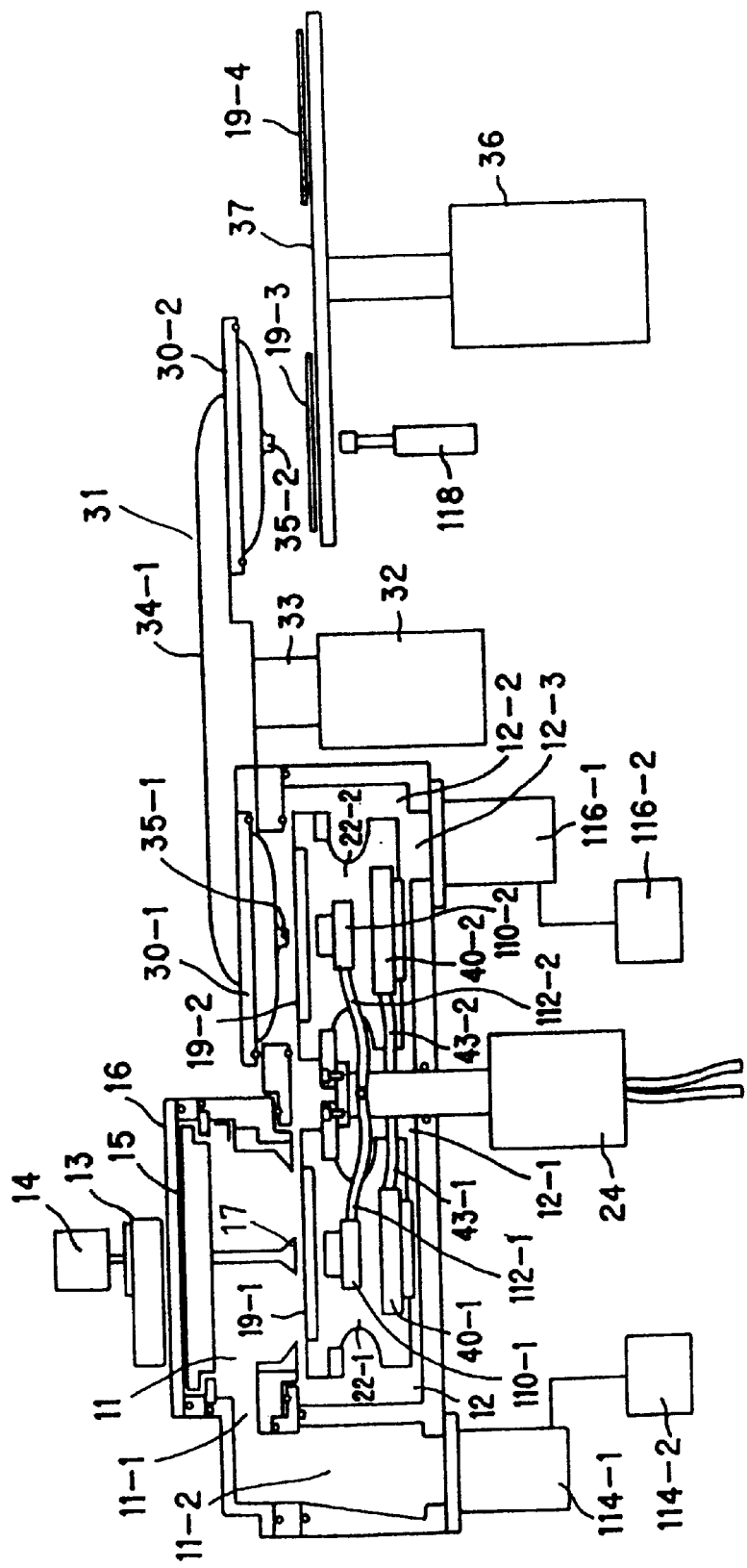
FIG. 10 shows a cross section of the vacuum apparatus as a further different embodiment according to the present invention.

FIG. 10 is a cross sectional view showing a vacuum apparatus according to a further different embodiment of the present invention. In FIG. 10, parts corresponding to those of the vacuum apparatus shown in FIG. 1 are indexed with the corresponding symbols and detailed explanation is omitted here. In this embodiment, although drive mechanisms 40-1, 40-2 for a vacuum apparatus (from now on called as a first drive mechanisms for a vacuum apparatus) are mounted at a lower portion of susceptors 22-1, 22-2, second drive mechanisms 110-1, 110-2 are mounted respectively at an upper portion of the susceptor 22-1, 22-2. These second drive mechanisms 110-1, 110-2 reciprocally drive upward and downward the disk substrates 19-1, 19-2, which are placed on an upper surface of susceptors 22-1, 22-2 respectively. The second drive mechanisms 110-1, 110-2 are supplied with a high pressure gas through second high pressure supply pipes 112-1, 112-2 independent from high pressure gas supply pipes 43-1, 43-2 (hereinafter called as first high pressure gas supply pipes). In the vacuum apparatus shown in FIG. 10, an exhaust mechanism for a sputtering chamber 11 and for a disk transport chamber 12 are shown, which are omitted in FIG. 1. More specifically, an exhaust duct 11-2 is provided at an exhaust port 11-1 formed in a sidewall of the sputtering chamber 11, the exhaust duct 11-2 being provided adjacent to the disk transport chamber 12 and extending to a bottom portion of the vacuum apparatus. An exhaust main pump 114-1 and an auxiliary pump 114-2 are connected to a lower end of the exhaust duct 11-2. A main pump 116-1 and an auxiliary pump 116-2 for exhausting are connected to an exhaust port 12-3 formed on the bottom wall of a second airtight space 12-2. A disk pusher 118 is provided at a disk transport table 37 for chucking and releasing the disk substrate 19-3, 19-4 on a mechanical chuck 35-1, 35-2 of an external disk transport mechanism 31.

Figure 11:
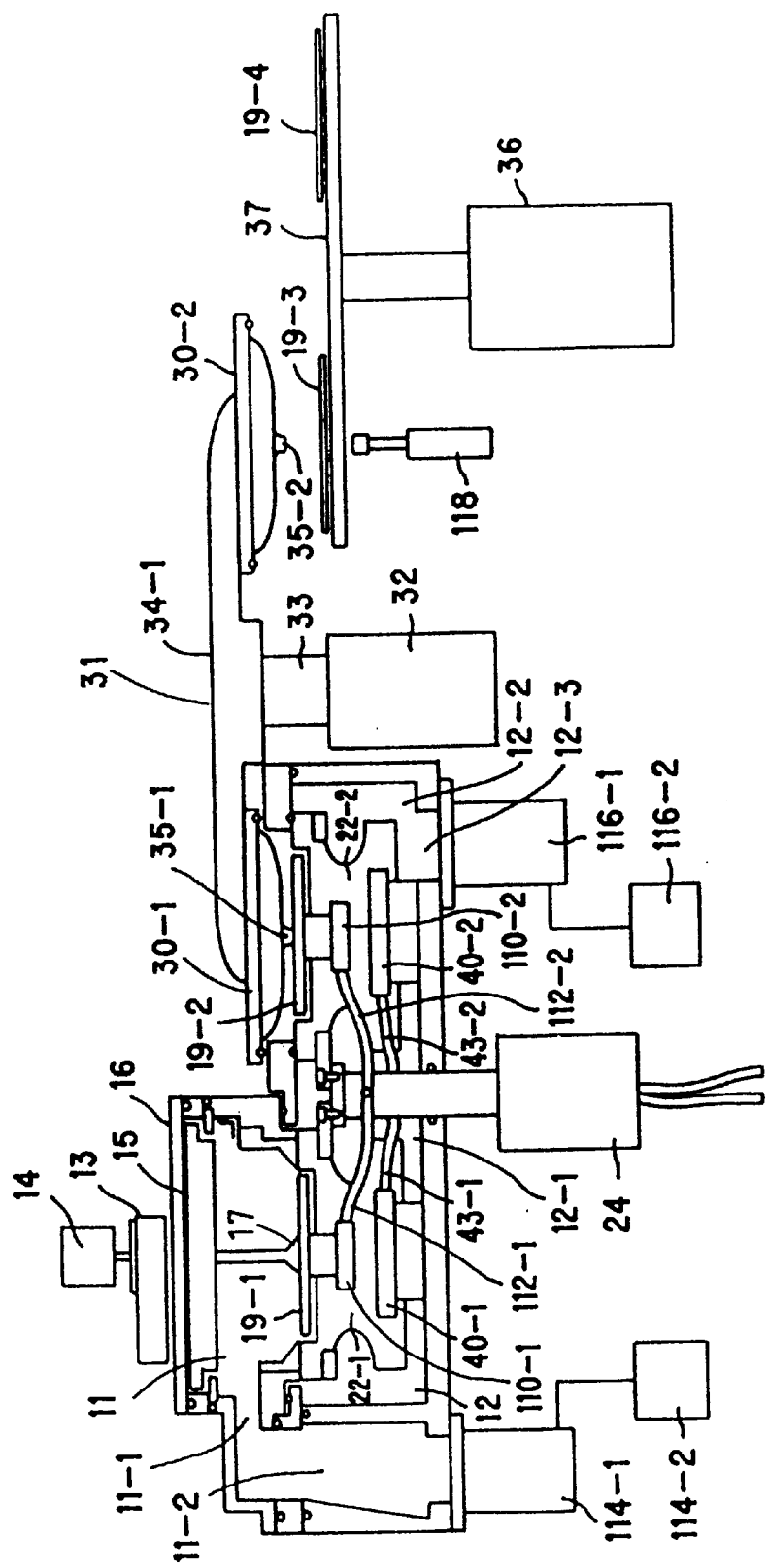
FIG. 11 is a cross sectional view for explaining an operation of the vacuum apparatus shown in FIG. 10.

FIG. 11 shows a situation in which the susceptors 22-1, 22-2 are elevated upward by a first driving mechanism 40-1, 40-2 and disk substrates 19-1, 19-2 are elevated upward by second drive mechanisms 110-1, 110-2. In this situation, the disk substrate 19-1 is pushed to a lower surface of a center mask 17 in the sputtering chamber 11 and the disk substrate 19-2 is brought in contact with a lower surface of a vacuum lid 30-1.

Figure 12:
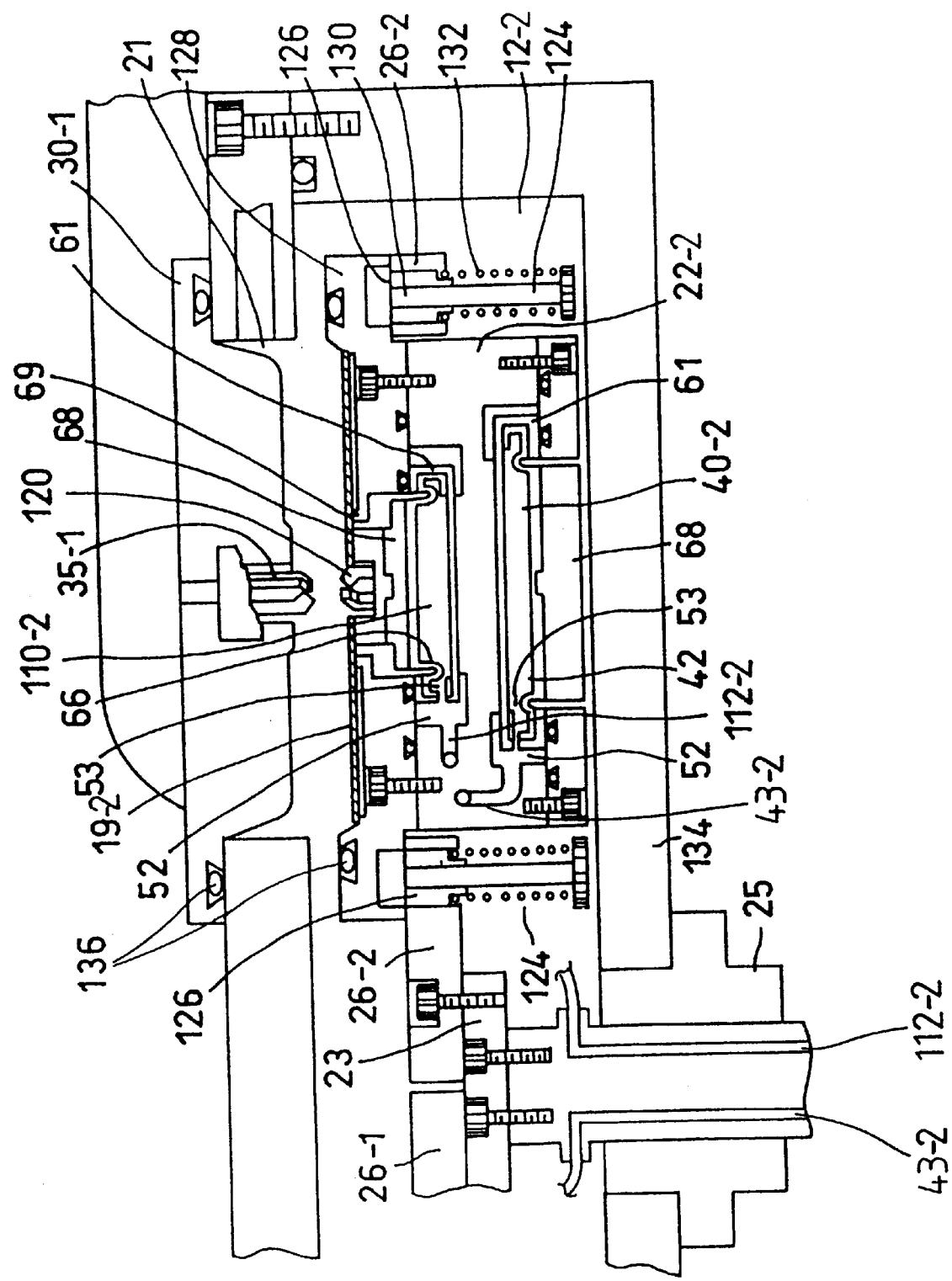
FIG. 12 is a cross sectional view for showing a portion of the vacuum apparatus shown in FIG. 10 and FIG. 11.
Figure 13:
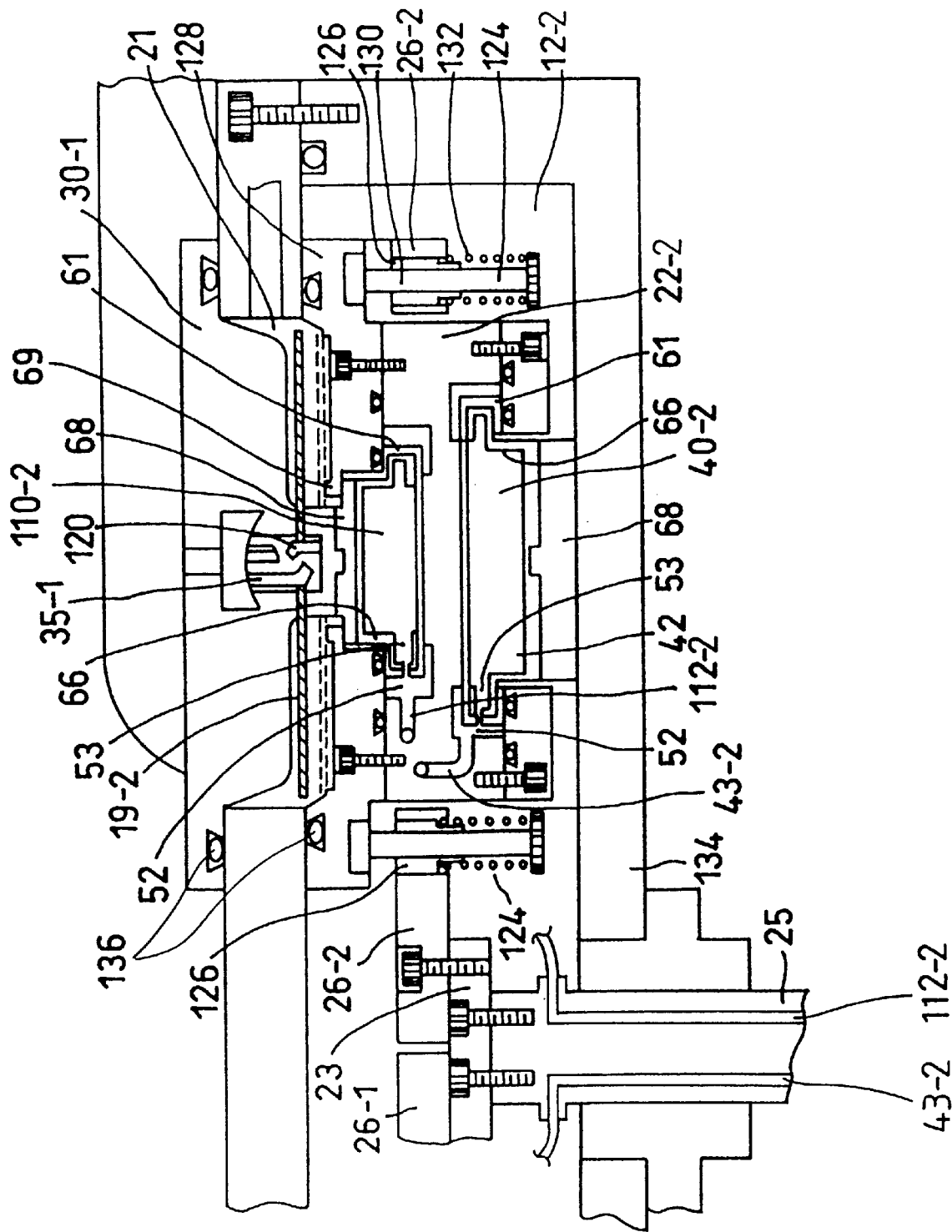
FIG. 13 is a cross sectional view for showing an operation of the vacuum apparatus shown in FIG. 12.

FIGS. 12 and 13 are cross sectional views showing a more specific structure and operation of the drive mechanisms provided on the susceptors in the vacuum apparatus shown in FIGS. 10 and 11. In FIGS. 12 and 13, the same components as those shown in FIGS. 1 to 5 and FIGS. 10 to 11 are indexed with the same symbols and detailed explanation is omitted here.

As shown in FIG. 12, the susceptor 22-2 held by a ring shaped horizontal arm 26-2 of an internal disk transport mechanism 23 is positioned right under an opening 21 of a transport chamber 12. On the lower surface of susceptor 22-2, a first drive mechanism 40-2 is mounted. On the upper surface of susceptor 22-2, a second drive mechanism 110-2 is mounted. The first driving mechanism 40-2 is mounted on the lower surface of susceptor 22-2 upside down, so that the air bag 42 is projecting toward a bottom portion 134 of the disk transport chamber 12. On the contrary, in the second drive mechanism for a vacuum apparatus 110-2, air bag 66 is mounted on the upper surface of the susceptor 22-2 so as to project toward a ceiling of the disk transport chamber 12. The second drive mechanism 110-2 has an reinforce member 68 shown in FIG. 5, so that the upward projection of the air bag 66 is limited to a certain range by a stopper 69. On the upper surface of the reinforce member 68, a center guide 120 is fixed for coupling with a center hole of the disk substrate 19. This center guide 120 includes three under jaws corresponding to three upper jaws included in a mechanical chuck 35-1. This center guide 120 retains the disk substrate 19-2 on the upper surface of the susceptor 22-2 before the disk substrate 19-2 is elevated. However, when the disk substrate 19-2 is elevated, the upper jaws of the chuck 35-1 extend through the center hole of disk substrate 19-2 to hold the disk substrate 19-2 mechanically.

A plurality of susceptor restoring mechanisms 124 is also equipped in susceptor 22-2 held by a ring shaped horizontal arm 26-2 of the internal disk transport mechanism 23. These susceptor restoring mechanisms 124 includes a plurality of through holes 126 formed on the horizontal arm 26-2 around susceptor 22-2, guide shafts 130 extending through these through holes 126 with upper ends being fixed on a collar 128 of the susceptor 22-2, and coil springs 132 into which the guide shaft 130 is loosely inserted. The coil springs 132 provide a lower end of the guide shaft 130 and a lower surface of the horizontal arm 26-2 with an elastic force to pull these two objects apart with each other. In FIG. 12 and FIG. 13, a symbol 134 shows an exhaust port of the disk transport chamber 12, and a symbol 136 shows O-rings for the vacuum sealing respectively.

In the next, the drive operation of susceptor 22-2 and disk substrate 19 by the first drive mechanism 110-2 for a vacuum apparatus, are explained using FIG. 12 and FIG. 13. In FIG. 12, both first drive mechanism 40-2 and second drive mechanism 110-2 are not supplied with the high pressure gas for driving, so each air bag 42, 66 is stored in the container 61. When the high pressure gas is supplied to the first drive mechanism 40-2 and to the second drive mechanism 110-2 through the first and second high pressure gas supply pipe 43-2 and 112-2 respectively. The air bag 42 expands and projects downward and the air bag 66 expands and projects upward from each container 61. The air bag 42 of the first drive mechanism 40-2 pushes the bottom plate 134 of the disk transport chamber 12 through the reinforce member 68, thereby the susceptor 22-2 being elevated by reaction of the bottom plate 134 against the air bag 42. With the susceptor 22-2 being elevated, susceptor 22-2 closes the opening 21 of the transport chamber 12 and coil springs 132 of the restoration mechanism 124 are compressed.

On the other hand, the air bag 66 of the second drive mechanism 110-2 pushes the disk substrate 19 upward through the reinforce member 68 toward the vacuum lid 30-1 of the external disk transport mechanism 31. The upper jaws of the mechanical chuck 35-1 are inserted into the center hole of the disk substrate 19 and are expanded there to hold the disk substrate 19-2. When the high-pressure gas is exhausted from the first and the second drive mechanism 40-2, 110-2, the coil spring 132 of the restoration mechanism 124 restores by its elastic force to return the susceptor 22-2 to its original position shown in FIG. 12.

In FIGS. 12 and 13, although the explanation was made about susceptor 22-2 arranged under the opening 21 of the disk transport chamber 12, it is needless to say, the susceptor 22-1 arranged under the opening 20 of the sputtering chamber 11 shown in FIGS. 10, and 11 performs similar operation to that of the susceptor 22-2 with a simpler structure. That is, susceptor 22-1 arranged under the opening 20 of sputtering chamber 11 closes the opening 20 of the sputtering chamber 11 and pushes the disk substrate 19-1 upward in the sputtering chamber 11 to make it contact with the lower surface of the center mask 17.

By moving disk substrate 19-1, 19-2 by the second drive mechanism 110-1, 110-2 in the manner described, the following problems remained unsolved in conventional apparatus can be solved. More specifically, in sputtering chamber 11, the susceptor 22-1 is made contact with the opening 20 and the disk substrate 19-1 is made contact with the center mask 17 respectively. However it is difficult from a mechanical precision point of view to make two different articles, susceptor 22-1 and disk substrate 19-1, contact with two different objects, the sputtering chamber opening 20 and the center mask 17 at the same time. O-rings 136 are provided on the upper surface of the susceptor 22-1, 22-2 for sealing the disk transport chamber 12 from the atmosphere while they are pressed to the opening 21 of the disk transport chamber 12. This O-ring 136 is not pressed with sufficient force because there is no need to seal the atmosphere at the opening 20 of the sputtering chamber 11. The susceptor 22-1 and sputtering chamber opening 20 thus do not contact closely because O-rings 136 are interposed between them, thereby the gap size between them being not determined. For the reason, it is difficult to make the disk substrate 19-1 to contact with the center mask 17 or with an outer periphery mask (not illustrated). That is to say, if one tries to make contact the disk substrate 19-1 with the center mask 17, a case may occur that the O-ring 136 of the susceptor 22-1 would not make contact with the sputtering chamber opening 20. On the contrary, if the O-ring 136 of susceptor 22-1 is made contact with the opening 20 of the sputtering chamber 12, a case may occur that the disk substrate 19-1 would not make contact with the center mask 17. The problems described are, however, solved by driving the susceptors 22-1, 22-2 and the disk substrates 19-1, 19-2 with separate drive mechanisms for a vacuum apparatus.

Furthermore, on the side of the opening 21 of the disk transport chamber 12, the external disk transport mechanism 31 uses the mechanical chucks 35-1, 35-2 or vacuum chucks for receiving and releasing the disk substrate 19-2, 19-3. On the upper surface of susceptor 22-1, 22-2, a receiving recess for the disk substrate 19-2, 19-3 having a tapered wall followed by a vertical wall which prevents the disk substrate 19-2, 19-3 from being thrown out while the disk substrate 19-2 or 19-3 placed on the susceptor is transported to the sputtering chamber 11 with high speed. The disk substrates 19-1, 19-2 are, therefore, placed in a deep position about 5 mm below the upper surface of the susceptor 22-1, 22-2. The chucking mechanism such as mechanical chucks 35-1, 35-2 of the external disk transport mechanism 31 needs a long chucking mechanism, such as at least 5 mm projected from the lower surface of vacuum lid 30-1, which closes the opening 21 of the disk transport chamber 12 hermetically to take out the disk substrate 19-1, 19-2 placed in this deep position. On the other hand, susceptors 22-1, 22-2 on which the disk substrate 19-1, 19-2 are placed need a total clearance of 7 mm including the clearance of 2 mm to be transported avoiding a collision with the chucking mechanism. Susceptors 22-1, 22-2 might secure the clearance while being moved up and down by these drive mechanism 40-1, 40-2. However, when the stroke of the up and down movement of the susceptors 22-1,22-2 become longer, the drive mechanism 40-1, 40-2 become large in sized and expensive in costs as well as time for moving up and down becomes longer. It is, therefore, necessary to decrease the stroke by even 1 or 2 mm. Moving disk substrate 19-1,19-2 up and down by a separate drive mechanism from those driving the susceptor 22-1, 22-2 up and down fulfills these requirements in the conventional vacuum apparatus.

Figure 14:
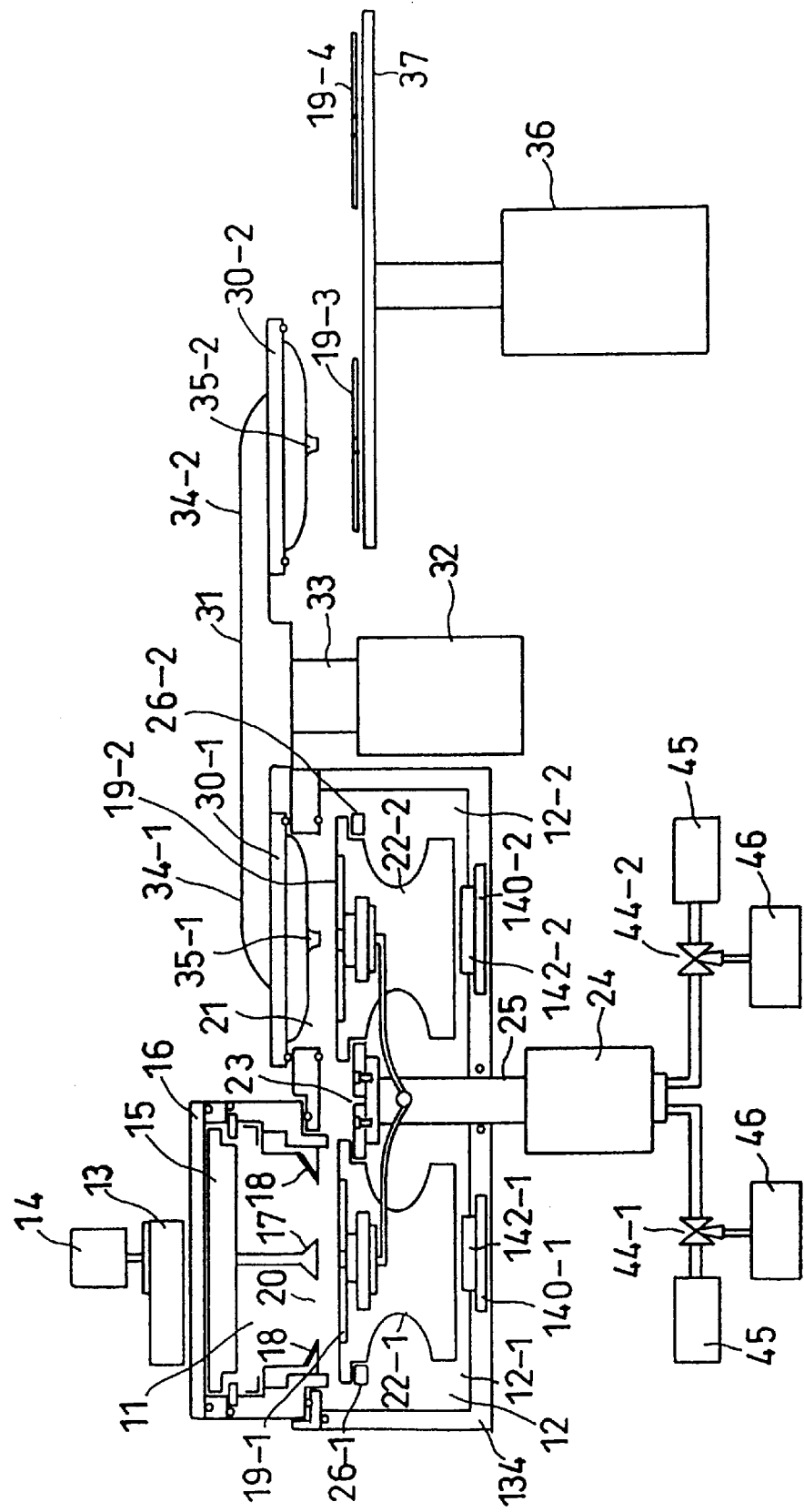
FIG. 14 is a cross sectional view of the vacuum apparatus according to the further different embodiment of the present invention.

FIG. 14 is a cross sectional view of a vacuum apparatus showing a further different embodiment according to the present invention. In this figure, the components corresponding to those of vacuum apparatus shown in FIG. 1, FIG. 10 or FIG. 11 are indexed with the same symbols and detailed explanation is omitted below. In this embodiment, first drive mechanisms 140-1, 140-2 for raising and descending the susceptors 22-1, 22-2 are provided on the bottom of disk transport chamber 134 instead of being provided on the side of the susceptor 22-1, 22-2, so that the air bags 142-1, 142-2 project their portions toward the susceptor 22-1, 22-2.

This embodiment has advantages that the susceptor is light in weight and thin in depth. That is to say, air bag drive mechanisms 140-1, 140-2 are installed at the bottom portion of the transport chamber, with only the projected portions of air bag 142-1, 142-2 being attached to the lower surface of the susceptor 22-1, 22-2 for being driven.

Air bags may be installed both on the lower end of susceptor and on the bottom of transport chamber depending on manufacturing condition or a shape of lower end of the susceptor.

The invention has been explained with reference to various embodiments. However, needless to say, the present invention is not limited to these embodiments, but many variations are available within the scope of the present invention.

For example, in the vacuum apparatus shown in FIG. 1, FIG. 10, FIG. 11, and FIG. 14, a single sputtering chamber is shown, but needless to say, as is shown in FIG. 7, the present invention can be applied to a vacuum apparatus provided with a plurality of sputtering chambers for depositing different kinds of films. In this case, a common transport chamber may be provided for a plurality of sputtering chambers into which the disk substrates are transported from outside. The disk substrate is then transported to each of the sputtering chambers by a transport mechanism, which rotates in horizontal plane. A film is formed on the disk substrate in the sputtering chambers. The disk substrate is then taken out from the vacuum apparatus through the common transport chamber.

As described above, since the drive mechanism for a vacuum apparatus according to the present invention is operated by a high-pressure gas and thus can be made in small size, whole of the drive mechanism can be installed inside the vacuum apparatus. Therefore, a special means or mechanism for vacuum seal is not necessary, and impurities such as lubricant ingredient do not be brought into the vacuum apparatus.

Although above explanations are made with the embodiments of the present invention in which magnetron sputtering apparatus is used, the present invention can be applied to not only sputtering apparatus but also to film forming apparatuses including a CVD apparatus or a vacuum deposition apparatus, and to an etching apparatus including a CDE or a RIE apparatuses.

What is claimed is:

1. A vacuum apparatus comprising:
    a transport chamber having an air-tight space for transporting an object to be treated having a first and a second openings formed in a wall forming said transport chamber,
    a treating chamber having an airtight space which communicates with said transport chamber through said first opening,
    a transport mechanism provided in said transport chamber for transporting a susceptor on which an object to be treated is placed between said first and second opening, and
    a drive mechanism for a vacuum apparatus provided on said transport mechanism for driving said susceptor so as to open and close airtight said first and second opening,
    said drive mechanism for a vacuum apparatus further comprising:
        an air bag stored in said container,
        a means for supplying a pressurized gas in said air bag, wherein a part of said air bag is projected from said open end of the air bag container by supplying said air bag with a pressurized gas by said pressurized gas supply means, thereby moving said susceptor to said first or second opening to close it airtight.

2. The vacuum apparatus as claimed in claim 1, characterized in that an external transport mechanism is provided outside said transport chamber, and that said external transport mechanism comprises a horizontal arm, which rotates on a vertical rotation axis and a vacuum lid, which is provided at an end of said horizontal arm for opening or closing said second opening of said transport chamber.

3. The vacuum apparatus as claimed in claim 1 or 2, characterized in that said treating chamber is one or a plurality of sputtering chambers communicated with said transport chamber, and that said object to be treated is a disk substrate.

4. The vacuum apparatus as claimed in any one of claims 1 to 2, characterized in that said drive mechanism for a vacuum apparatus is further provided with a means, other than said air bag, for exhausting the gas in said air bag, wherein a part of said air bag projected from the open end of said air bag container is withdrawn in said air bag container by exhausting the gas inside said air bag by said means for exhausting the gas.

5. The vacuum apparatus as claimed in claim 4, characterized in that said air bag is provided with an elastic means which withdraws said part of the air bag into said air bag container by elastic force when the gas inside is exhausted by said exhaust means.

6. The vacuum apparatus as claimed in claim 4, characterized in that said means for exhausting the gas from said air bag exhausts the gas through an opening formed in said air bag container.

7. The vacuum apparatus as claimed in claim 4, wherein said means for exhausting a gas comprises a pump.

8. A vacuum apparatus comprising:
   a sputtering chamber in which an airtight discharge space is provided,
   a magnetic field generating device located above said sputtering chamber to generate a magnetic field in said sputtering chamber,
   a target provided at an upper portion of said sputtering chamber to which said magnetic field is applied by said magnetic field generating device,
   a transport chamber which communicates with said sputtering chamber through an opening formed on a bottom wall of said sputtering chamber and provides an airtight space extended horizontally from a bottom portion of said transport chamber, having another opening provided on a ceiling portion of said transport chamber,
   an internal disk transport mechanism which is provided in said transport chamber for transporting susceptors for placing a disk substrates on which a sputtering film is formed, alternately between said first and a second openings,
   a plurality of vacuum lids which couple to said second opening of said transport chamber for sealing airtight and removably holding the disk substrates on the lower surface,
   an outer disk transport mechanism which transports said vacuum lids between said opening in said transport chamber and a disk support table which is arranged at a position separated from transport chamber and
   a drive mechanism for a vacuum apparatus, said drive mechanism for a vacuum apparatus further comprising:
      an air bag container with one end open, which is mounted on a bottom portion of said susceptor
      an air bag stored in said container,
      a means for supplying a pressurized gas in said air bag,
      wherein a part of said air bag is projected from said open end of the air bag container to push a bottom of said transport chamber, by supplying said air bag with a pressurized gas by said pressurized gas supply means, thereby moving said susceptor to said second opening to close it airtight.

9. The vacuum apparatus according to claim 8, characterized in that a second drive mechanism is provided on a upper surface of said susceptor for lifting the disk substrate from an upper surface of said susceptor when said susceptor is made contact with said opening of said sputtering chamber or said opening of said transport chamber, thereby inserting the disk substrate into a disk chucking mechanism provided on said vacuum lid of said outer disk transport mechanism, or making said disk substrate on a center mask in said sputtering chamber.

10. The vacuum apparatus as claimed in claim 9, characterized in that said drive mechanism for a vacuum apparatus is further provided with a means, other than said air bag, for exhausting gas inside said air bag, and wherein by exhausting gas inside said air bag by means, a part of said air bag projected from the open end of said air bag container is withdrawn and stored and by this action, an object is moved in said vacuum vessel.

11. The vacuum apparatus as claimed in claim 10, characterized in that said air bag is provided with an elastic means which withdraws said part of the air bag into said air bag container by elastic force when the gas inside is exhausted by said exhaust means.

12. The vacuum apparatus as claimed in claim 11, characterized in that said means for exhausting gas in said air bag exhausts gas through penetrating opening which is provided penetrating through said air bag container.

13. The vacuum apparatus as claimed in claim 10, wherein said means for exhausting a gas comprises a pump.

14. A vacuum apparatus comprising:
   a disk transport chamber, inner surfaces of which form a polygonal space and openings being formed in the inner wall surface corresponding to a plurality of sides to the polygon,
   a hollow rotating shaft arranged to extending vertically at a central portion of an inside of said transport chamber,
   a frame which is arranged around said rotating shaft and which rotates with the rotation of said rotating shaft,
   a plurality of air bag drive mechanisms provided fixedly on the outer surface of said frame,
   a plurality of pipes each connected with said air bag drive mechanisms through an inside of said hollow rotating shaft in order to supply pressurized gas to said air bag drive mechanisms or exhaust gas from these drive mechanisms,
   a plurality of susceptors driven by each of said air bag drive mechanisms, and provided to block the openings formed on the inner wall surface of said disk transport chamber,
   a plurality of sputtering chambers provided to connect through said openings, and
   a load lock mechanism which is provided outside said disk transport chamber and which transports disk into said disk transport chamber through said opening, or transport disks out of said disk transport chamber.

15. The vacuum apparatus as claimed in claim 14, characterized in that said plurality of sputtering chambers are equipped with targets, each target being composed of a material which is different than the material of the other targets, for forming different kinds of films on said disk surfaces.

* * * * *